United States Patent
White et al.

(10) Patent No.: US 7,685,483 B1
(45) Date of Patent: Mar. 23, 2010

(54) DESIGN FEATURES FOR TESTING INTEGRATED CIRCUITS

(75) Inventors: Allen White, Austin, TX (US); Hemanshu T. Vernenker, Austin, TX (US); Louis De La Cruz, Pflugerville, TX (US)

(73) Assignee: Lattice Semiconductor Corporation, Hillsboro, OR (US)

(*) Notice: Subject to any disclaimer, the term of this patent is extended or adjusted under 35 U.S.C. 154(b) by 1224 days.

(21) Appl. No.: 11/157,345

(22) Filed: Jun. 20, 2005

(51) Int. Cl.
*G01R 31/3177* (2006.01)
*G01R 31/40* (2006.01)

(52) U.S. Cl. .................. 714/724; 714/707
(58) Field of Classification Search ............... None
See application file for complete search history.

(56) References Cited

U.S. PATENT DOCUMENTS

| | | | |
|---|---|---|---|
| 4,467,444 A * | 8/1984 | Harmon et al. | 712/42 |
| 4,940,909 A * | 7/1990 | Mulder et al. | 326/38 |
| 5,241,506 A * | 8/1993 | Motegi et al. | 365/149 |
| 6,385,748 B1 * | 5/2002 | Chen et al. | 714/724 |
| 6,396,759 B1 * | 5/2002 | Lesher | 365/225.7 |
| 6,703,860 B1 * | 3/2004 | Agrawal et al. | 326/41 |
| 6,757,204 B2 * | 6/2004 | Di Ronza et al. | 365/200 |
| 6,883,129 B2 * | 4/2005 | Biewenga et al. | 714/738 |
| 7,114,135 B1 * | 9/2006 | Gauvin | 716/4 |
| 7,251,772 B2 * | 7/2007 | Stocken et al. | 714/798 |
| 2001/0056557 A1 * | 12/2001 | Kawagoe et al. | 714/723 |
| 2002/0070744 A1 * | 6/2002 | Linn | 324/763 |
| 2002/0087928 A1 * | 7/2002 | Six | 714/726 |
| 2003/0107939 A1 * | 6/2003 | Yoon et al. | 365/222 |
| 2005/0060621 A1 * | 3/2005 | Lee et al. | 714/718 |

* cited by examiner

*Primary Examiner*—Kevin L Ellis
*Assistant Examiner*—Dipakkumar Gandhi
(74) *Attorney, Agent, or Firm*—Haynes and Boone, LLP (57) ABSTRACT

Systems and methods are disclosed herein to provide test features for integrated circuits. For example, in accordance with an embodiment of the present invention, an integrated circuit includes an input signal path adapted to route an address signal for a configurable memory. An input multiplexer, coupled to the input signal path, is controllable to route a first test signal provided via the input signal path for at least one memory configuration that does not use the input signal path for the address signal.

5 Claims, 11 Drawing Sheets

DESIGN FEATURES FOR TESTING INTEGRATED CIRCUITS

TECHNICAL FIELD

The present invention relates generally to electrical circuits and, more particularly, to testing integrated circuits.

BACKGROUND

Integrated circuits are becoming increasingly difficult to test and debug as their circuit dimensions decrease and their complexity increases. As an example, an embedded memory within a programmable logic device (e.g., a field programmable gate array or a complex programmable logic device) may be difficult to test and debug as the technology shrinks, because of the inability to probe internal signal values due to the small dimensions and the large number of metal layers. As a result, there is a need for techniques for determining critical internal signal values (e.g., during testing) and/or providing external signals as input signals to certain internal nodes (e.g., input signals to a memory) to facilitate testing and debugging operations.

SUMMARY

In accordance with one embodiment of the present invention, an integrated circuit includes an input signal path adapted to route at least one of an address signal and a data signal for a configurable memory; and an input multiplexer, coupled to the input signal path, controllable to route a first test signal provided via the input signal path for at least one memory configuration that does not use the input signal path for the at least one of the address signal and the data signal.

In accordance with another embodiment of the present invention, an integrated circuit includes means for providing an output signal path for an output signal; means for providing a first test signal; and means for selecting between the first test signal and the output signal, wherein the selecting means is controllable to provide the first test signal on the output signal path for at least one configuration of the integrated circuit that does not provide the output signal on the output signal path.

In accordance with another embodiment of the present invention, a method of providing test functionality for an integrated circuit includes providing an input signal path for an input signal for a memory within the integrated circuit; providing at least one memory configuration that does not use the input signal path for the input signal; and providing a first circuit for routing a first test signal provided via the input signal path, the first circuit adapted to route the first test signal for at least one memory configuration that does not use the input signal path for the input signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The techniques disclosed herein are applicable to a wide variety of integrated circuits and applications. As an exemplary implementation, a memory within a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of circuits and within the various types of integrated circuits. Therefore, the techniques may be applied to circuits other than memory and to integrated circuits other than PLDs.

For the exemplary application, an embedded memory within a PLD is typically configurable into different modes, widths, and configurations. For example, a 16 kbit embedded memory block may be configured as 1 k by 16, 2 k by 8, 4 k by 4, 8 k by 2, or 16 k by 1 memory (i.e., 16, 8, 4, 2, or 1 bit data widths). The 16 kbit memory would need 16 data input pins and 16 data output pins, because in the widest mode (i.e., 1 k by 16), the memory is 16 bits wide. Thus, for example, eight data input pins and eight data output pins would be unused in the 2 k by 8 mode.

The 16 kbit memory, for example, may represent a single port memory. However, the techniques disclosed herein may be applied to multiport memories or other types of memories of different sizes, widths, and configurations.

The 16 kbit memory may have the following exemplary pinout or input/output pin requirements, with input pins for CLK (clock signal); DIN[15:0] (input data bus); CS (chip select control signal); WE (write enable control signal); RST (reset control signal); ADDR[13:0] (input address); and output pins for DOUT[15:0] (output data bus). It should be noted that in every configuration, certain pins are unused. For example, only ten address bits are used (ADDR[9:0]) in a 1 k by 16 mode, with address bits (ADDR[13:10]) unused (i.e., certain address lines unused). Similarly, only one input data bit DIN[0] and one output data bit DOUT[0] are used in the 16 k by 1 mode, with input data bits DIN[15:1] and output data bits DOUT[15:1] unused (i.e., certain data lines unused).

Figure 1:
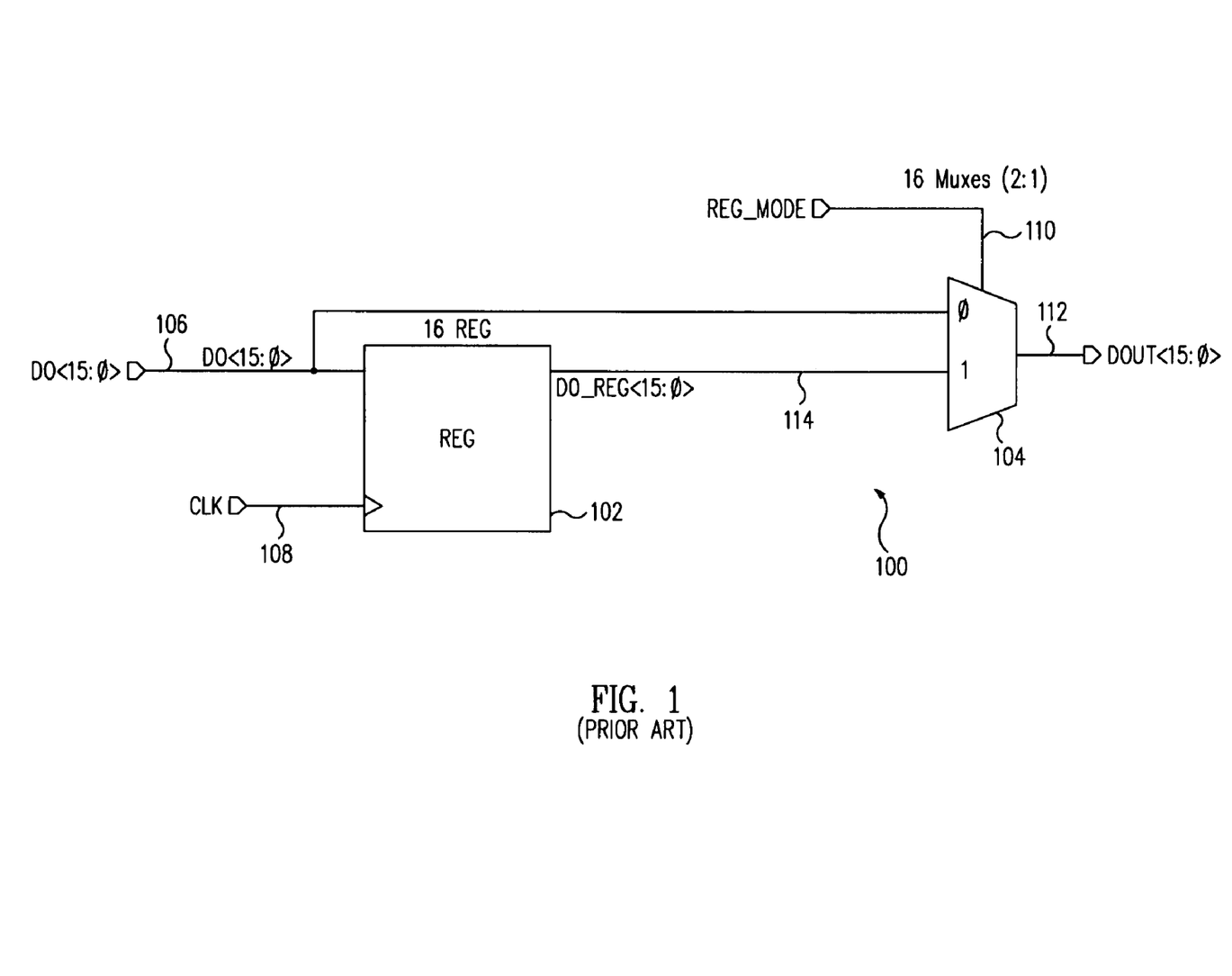
FIG. 1 shows a block diagram illustrating a conventional circuit.

For example, FIG. 1 shows a block diagram illustrating a conventional circuit 100 in accordance with an embodiment of the present invention. Circuit 100 may represent an output multiplexer circuit for a 16 kbit memory within a PLD, with circuit 100 including a register 102 and an output multiplexer 104.

Register 102 receives an input signal 106 and a clock signal 108 and provides an output signal 114. For example, register 102 may represent a number of registers (e.g., 16) that receive corresponding signals from input signal 106 (e.g., 16 corresponding signals, labeled DO<15:0>). Output signal 114 provides corresponding registered signals (e.g., 16 corresponding signals, labeled DO_REG<15:0>) to multiplexer 104 (e.g., 16 corresponding multiplexers). A control signal 110 controls multiplexer 104 to determine whether output signal 114 (i.e., registered signal) or input signal 106 (i.e., unregistered signal) is provided as an output signal 112 (e.g., 16 corresponding output signals labeled DOUT<15:0>).

As an example, output signal 112 may provide 16 registered or unregistered output data signals to output pins from multiplexer 104 (i.e., 16 2:1 multiplexers), with control signal 110 (REG_MODE) provided to multiplexer 104 for example by a configuration fuse (e.g., an SRAM cell or other types of fuses) of the PLD containing circuit 100. For example for the $16^{th}$ signal, if control signal 110 is asserted (e.g., logical high), then the registered output signal (DO_REG[15] of output signal 114) from one of registers 102 is provided as the output signal (DOUT[15] of output signal 112) from one of multiplexers 104. If control signal 110 is not asserted (e.g., logical low), then the unregistered input signal (DO[15] of input signal 106) is provided by one of multiplexers 104 as the output signal (DOUT[15] of output signal 112).

One drawback of circuit 100, however, is its limited test and debug functionality. For example, it may be difficult to test and debug signals associated with circuit 100, because of the inability to probe internal signal values. Therefore, in accordance with an embodiment of the present invention, techniques are disclosed to probe critical internal signals during silicon debug and testing. The techniques may not require additional output pins to port out the internal signals. For example in the exemplary memory implementation, the memory may be configured during a debug mode to a 2 k by 8 memory, as an example, with the critical internal signals ported out of the memory on one of the unused data output pins. The die area overhead may be minimal and may only require expanding one or more existing output multiplexers and/or adding one or more multiplexers.

As another example, in accordance with an embodiment of the present invention, techniques are disclosed to provide external signals as input signals to control internal timing during a debug mode. In a similar fashion as the example above, no additional input pins may be required to route the external signals into the memory, with minimal die overhead added (e.g., only expanding one or more existing output multiplexers and/or adding one or more multiplexers). For example as an exemplary implementation, the unused input data signals for the memory may be used to route the external signals into the memory (e.g., configured as a 2 k by 8 memory block) during a debug mode.

Figure 2:
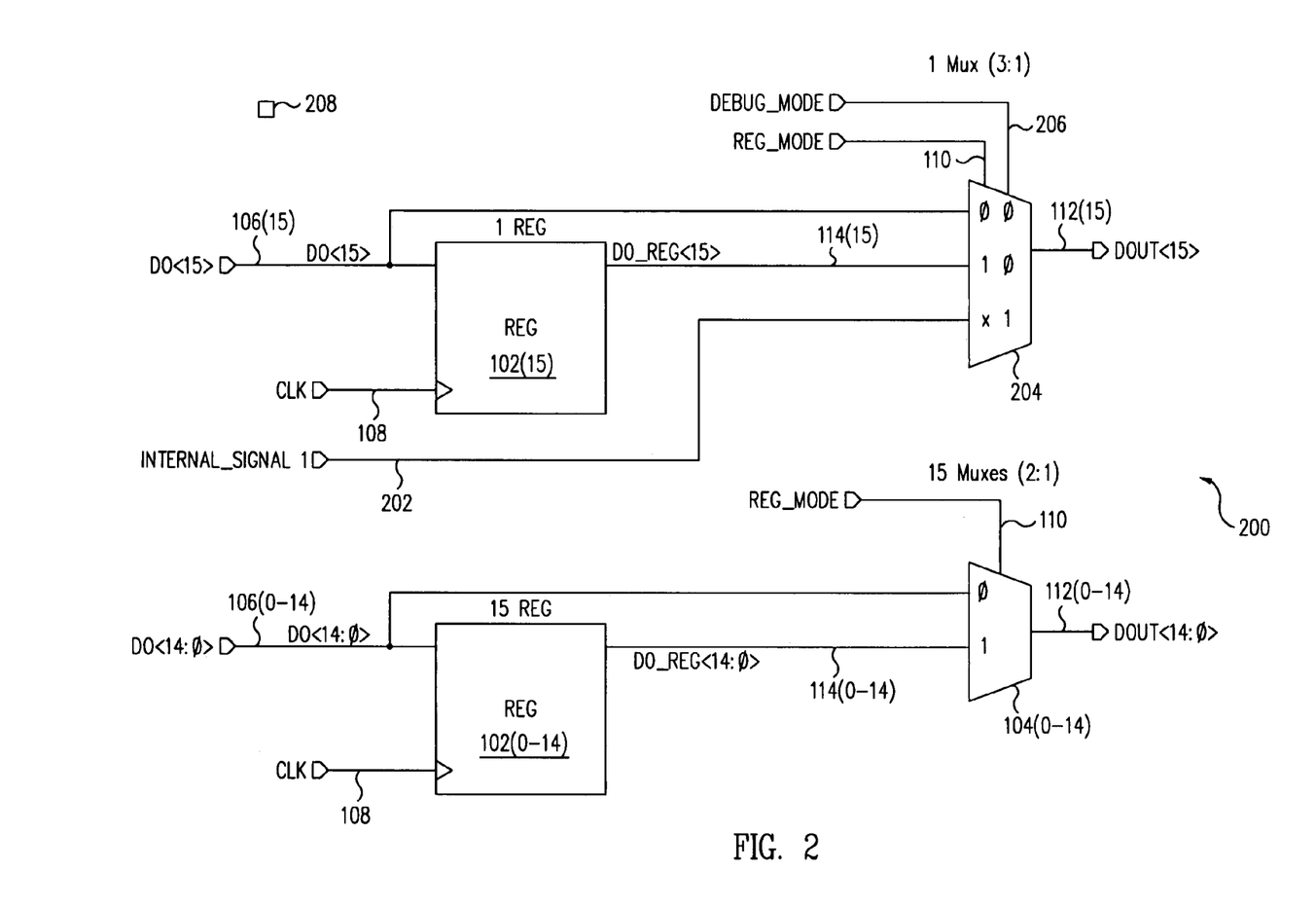
FIG. 2 shows a block diagram illustrating a circuit in accordance with an embodiment of the present invention.

For example, FIG. 2 shows a block diagram illustrating a circuit 200 in accordance with an embodiment of the present invention. Circuit 200 provides similar functionality as described for circuit 100 (FIG. 1), but includes additional design-for-test features and functionality.

Specifically, as an exemplary implementation, circuit 200 includes registers 102 (i.e., 16 registers which are referenced as registers 102(0-14) and 102(15)) and multiplexers 104 and 204 (i.e., 16 multiplexers, with fifteen 2:1 multiplexers referenced as multiplexers 104(0-14) and one 3:1 multiplexer 204). Registers 102(0-14,) multiplexers 104(0-14), register 102(15), and multiplexer 204 operate in a similar fashion as described in reference to FIG. 1 for registers 102 and multiplexers 104.

However, as shown in FIG. 2, the output multiplexer structure of circuit 200 is enhanced to accommodate a design-for-test feature, which allows a critical internal signal to be probed. Multiplexer 204 (providing output signal 112(15), labeled DOUT[15]) is a 3:1 multiplexer, with the additional input terminal for receiving an internal signal 202 (e.g., a critical signal (INTERNAL_SIGNAL1) that a test engineer may desire to probe in the debugging mode). A control signal 206 (DEBUG_MODE), which may be provided from a configuration fuse 208, determines whether internal signal 202 or one of input signal 106(15) and output signal 114(15), as controlled by control signal 110, is provided by multiplexer 204 (e.g., ported out).

For this exemplary implementation, the memory may be configured as a 16 k by 1 memory and, consequently, output signals 112(1-15) (i.e., DOUT[15:1]) are unused. Thus, output signal 112(15) (DOUT[15]) serves a dual purpose of providing output data in the 1 k by 16 memory configuration and providing internal signal 202 (e.g., a critical internal signal) in the 16 k by 1 memory configuration in a memory debug mode. As illustrated by this example, no additional pin overhead is required and the die area overhead is minimal because only an extra leg to an existing multiplexer is required along with an additional configuration fuse.

Figure 3:
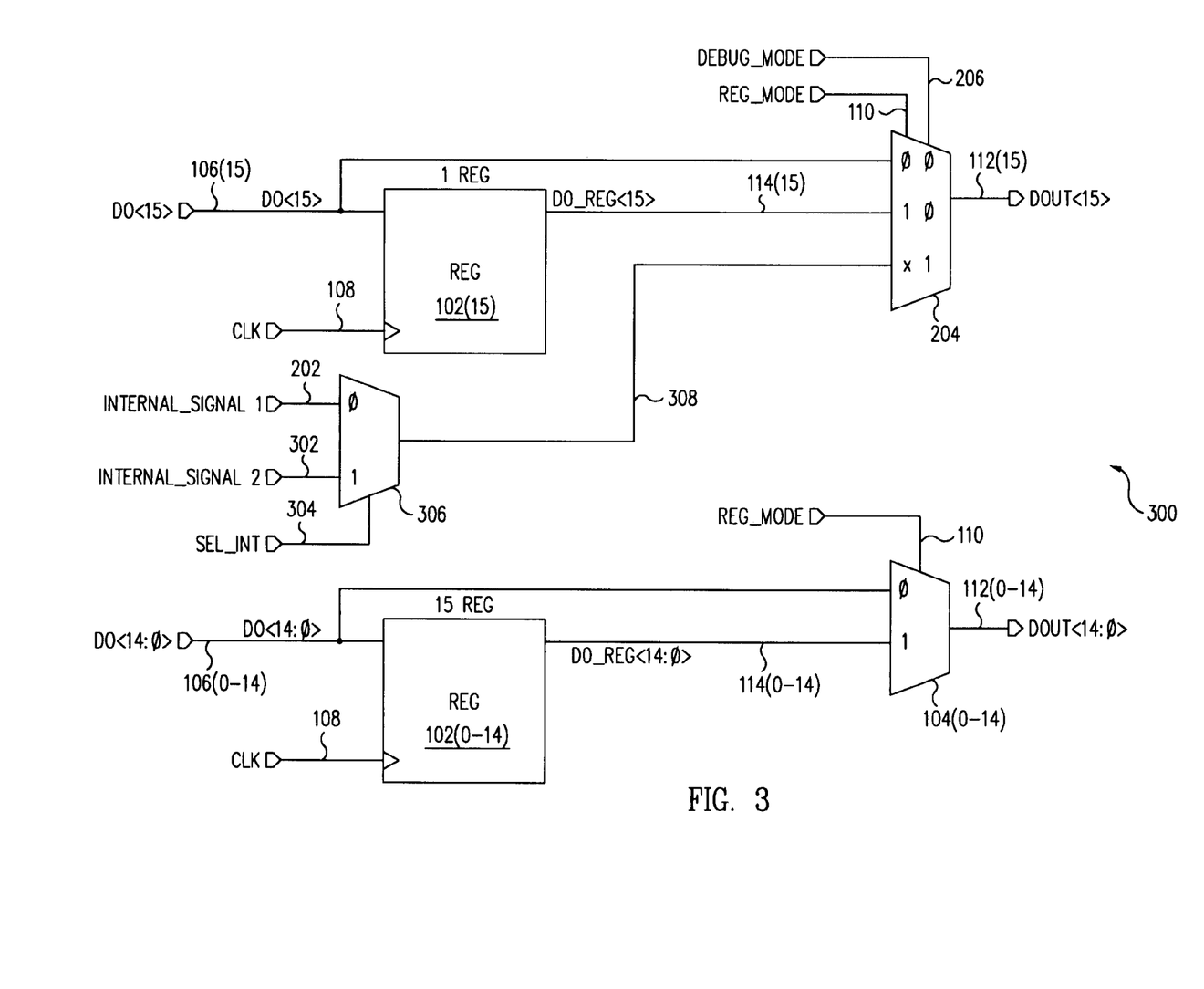
FIG. 3 shows a block diagram illustrating a circuit in accordance with an embodiment of the present invention.

The techniques disclosed in reference to FIG. 2 may be extended to provide a number of internal signals in accordance with an embodiment of the present invention. For example, FIG. 3 shows a block diagram illustrating a circuit 300 in accordance with an embodiment of the present invention. Circuit 300 is similar to circuit 200 but enhanced to provide internal signal 202 or an internal signal 302 (e.g., allows the test engineer to "probe" two critical internal signals).

Circuit 300 includes a multiplexer 306, controlled by a control signal 304 (SEL_INT) to control whether internal signal 202 or internal signal 302 is provided as an internal signal 308 to multiplexer 204. For example, with the memory configured as a 16 by 1 memory (DOUT[15:1] unused), the test engineer can control multiplexers 306 and 204 via control signals 304 and 206 (e.g., set by configuration fuses) to determine whether internal signal 202 or internal signal 302 is provided as output signal 112(15) in a test and debug mode.

As with the previous example, no additional pin overhead is required and the die area overhead remains minimal, with the addition of multiplexer 306, an additional leg to multiplexer 204, and two configuration fuses. It should be understood that FIGS. 2 and 3 are two exemplary implementations of design-for-test features in accordance with one or more embodiments of the present invention. Furthermore, it should be understood that the techniques disclosed herein may be applied to provide simultaneous probing of multiple internal signals for different circuit configurations.

The techniques disclosed herein may also be utilized to control not only the values of certain signals but also the timing of signals, such as during test and debug operations, in accordance with one or more embodiments of the present invention. As an example, these techniques may be applied to a row address decode path of a memory, as discussed herein for an exemplary implementation, or for many other types of signals within integrated circuits.

Figure 4:
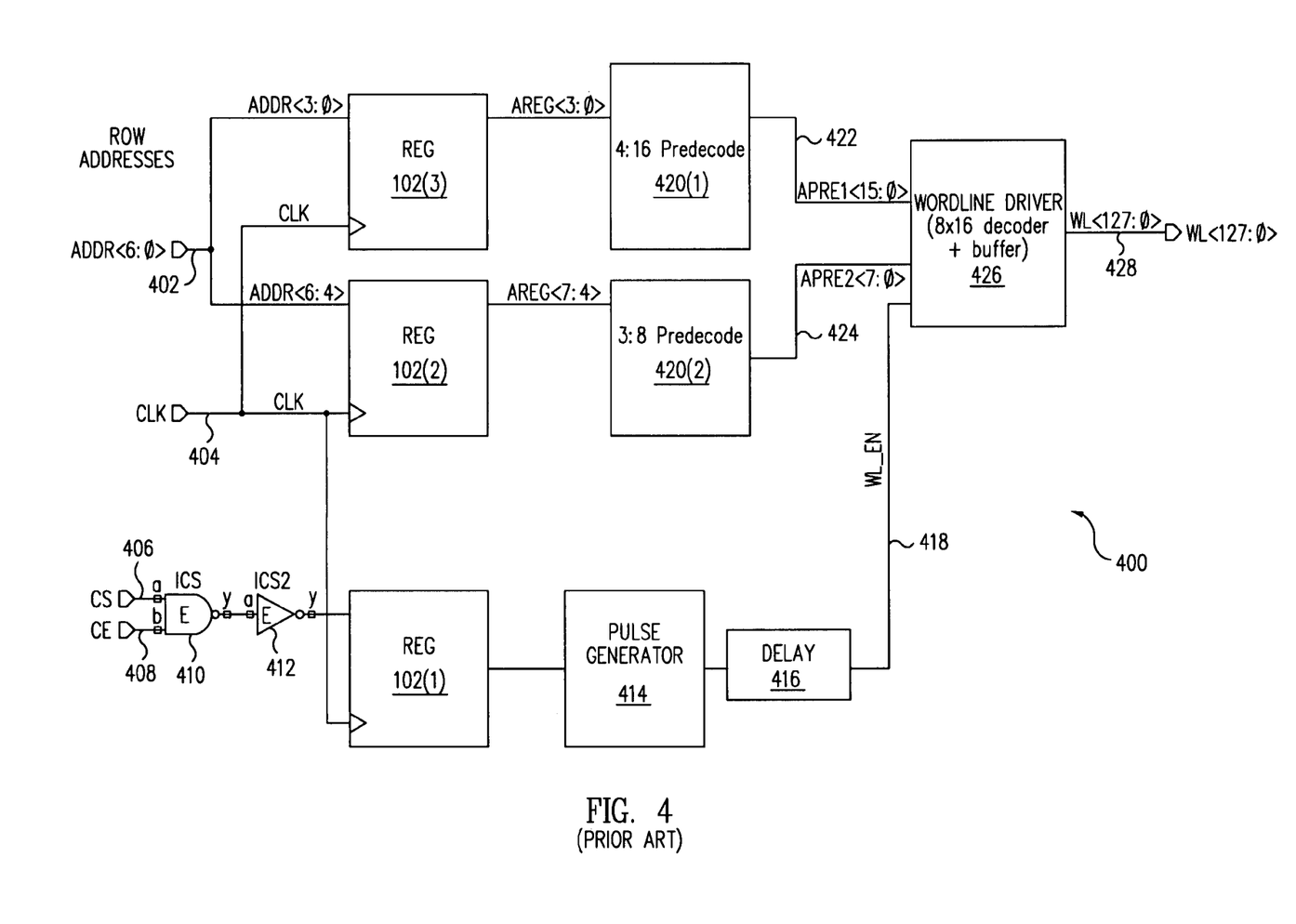
FIG. 4 shows a block diagram illustrating a conventional row address decoding path.

For example, FIG. 4 shows a block diagram of a circuit 400 illustrating a conventional row address decoding path for a synchronous memory. Circuit 400 includes three stages in the row address decoding path. The first stage includes input registers 102 (separately referenced as registers 102(1), 102 (2), and 102(3)), with address signals 402 (ADDR<6:0>) registered by registers 102(2) and 102(3). The second stage includes predecoders 420(1) and 420(2), where address signals 402 are predecoded. The third stage includes a wordline driver 426, which is the final decoder and buffer to drive a heavily loaded memory wordline 428.

A critical signal in the timing path is a wordline enable signal 418 (WL_EN), which gates wordline driver 426. A logical AND (by a logic gate 410 with an inverter 412) of a chip select signal 406 (CS) and a chip enable signal 408 (CE) is registered by register 102(1), passed through a pulse generator 414, and delayed by a delay element 416 to generate wordline enable signal 418 (WL_EN). Wordline enable signal 418 (WL_EN) must fire after predecoders 420(1) and 420(2) have settled down to avoid glitches on unselected wordlines or firing of multiple wordlines of wordline 428 and possibly functional failures.

Figure 5A:
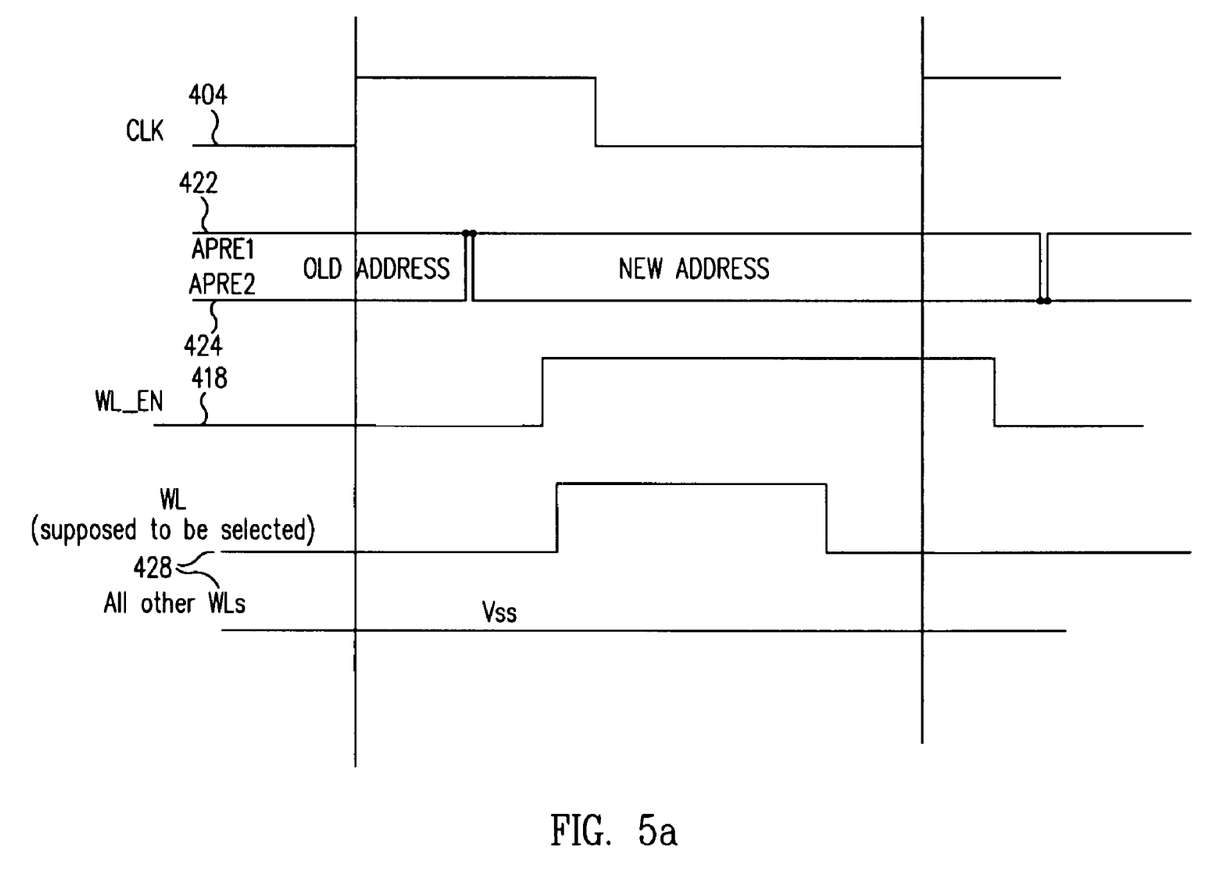
FIGS. 5a and 5b show timing diagrams illustrating timing features in accordance with one or more embodiments of the present invention.
Figure 5B:
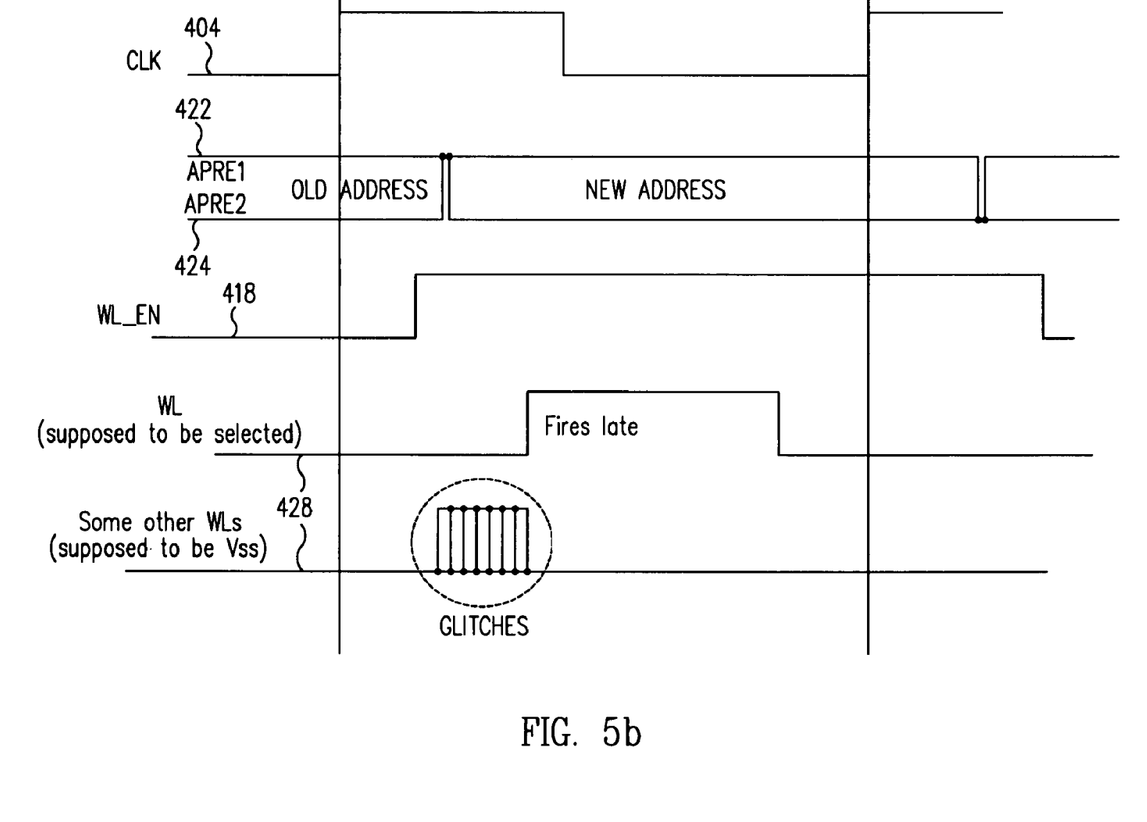

For example, FIGS. 5a and 5b show timing diagrams illustrating exemplary waveforms and timing features in accordance with one or more embodiments of the present invention. FIG. 5a shows the timing and exemplary waveforms in the row decoding path of circuit 400 for a clock signal 404, signals 422 and 424 from predecoders 420(1) and 420(2), respectively, wordline enable signal 418, and wordlines of wordline 428 (WL<127:0>). As illustrated, wordline enable signal 418 is asserted after signals 422 and 424 (i.e., the predecoded outputs APRE1 and APRE2 of predecoders 420 (1) and 420(2), respectively) have settled. Therefore, only one wordline of wordline 428 fires, as would be expected for a reliable memory operation, with the remaining wordlines of wordline 428 remaining low.

FIG. 5b shows the timing and exemplary waveforms in the row decoding path of circuit 400 when wordline enable signal 418 is asserted prior to signals 422 and 424 settling. During the period when wordline enable signal 418 is asserted (e.g., high) and while signals 422 and 424 (APRE1 and APRE2, respectively) are still changing, some wordlines of wordline 428 that are supposed to remain low may glitch, as illustrated in FIG. 5b. The wordline of wordline 428 that is supposed to fire, may actually fire late due to the delay in the path of wordline enable signal 418 (WL_EN). This timing issue may lead to a functional failure and, therefore, the ability to control the timing of the wordline enable signal 418 (WL_EN) via an external pin during test and debug operations is a highly desirable design-for-test feature.

Figure 6:
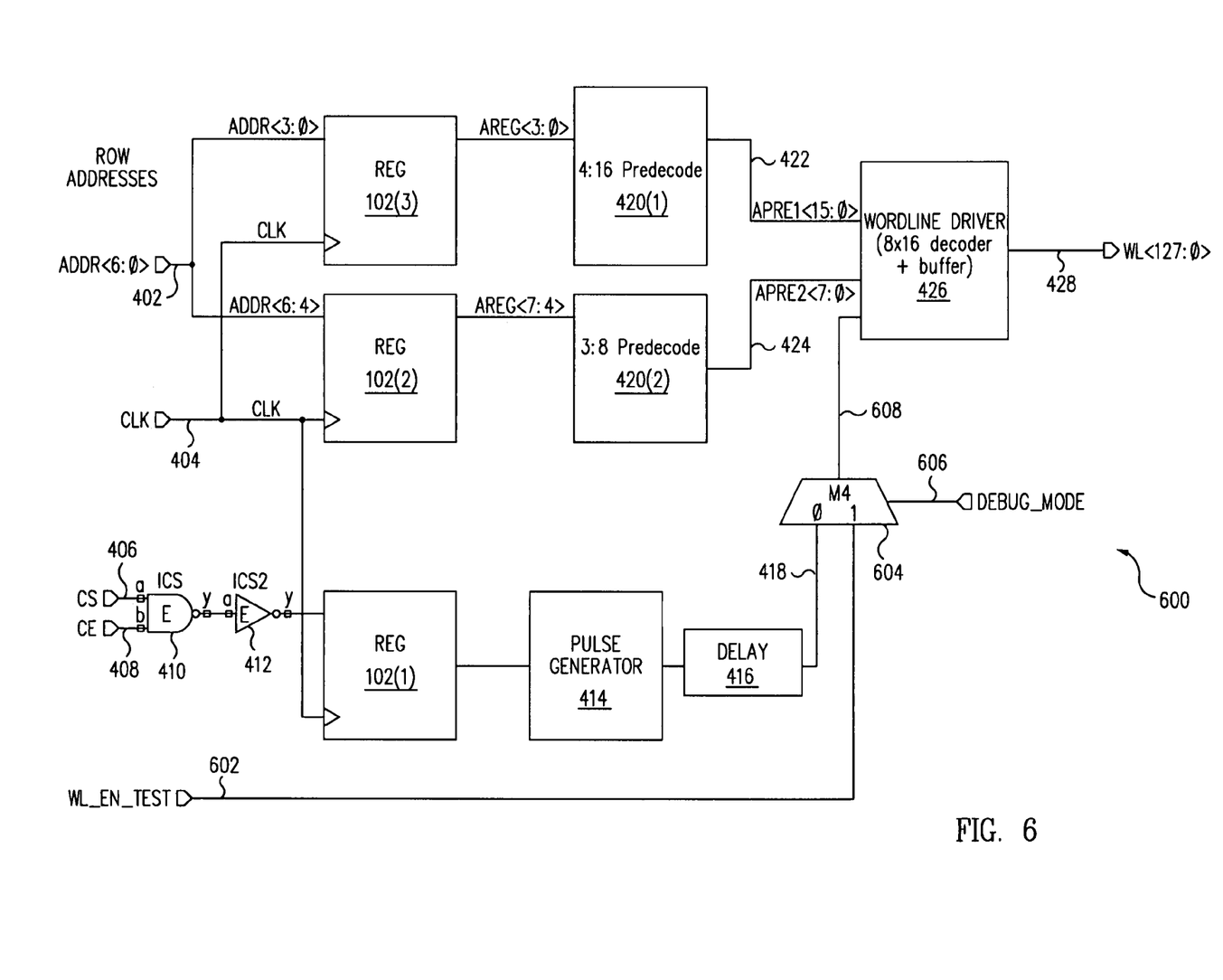
FIG. 6 shows a block diagram illustrating a row address decoding path in accordance with an embodiment of the present invention.

For example, FIG. 6 shows a block diagram of a circuit 600 illustrating an exemplary row address decoding path for a synchronous memory in accordance with an embodiment of the present invention. Circuit 600 illustrates an exemplary embodiment of a design-for-test feature that would provide a signal to control the timing of wordline enable signal 418 (WL_EN) (e.g., to test a possible failure on silicon). For example, this feature may be utilized to determine whether the cause of a failure was due to the violation of the margin between wordline enable signal 418 (WL_EN) and signals 422 and 424 (APRE1 and APRE2, respectively).

Circuit 600 is similar to circuit 400 (FIG. 4), but includes multiplexer 604 (e.g., a 2:1 multiplexer) inserted into the path of wordline enable signal 418. Multiplexer 604, under control of a control signal 606 (DEBUG_MODE), would select between wordline enable signal 418 during regular operation and a test signal 602 (WL_EN_TEST) during a debug mode to provide as a signal 608 to wordline driver 426. Control signal 606, which would determine whether the memory is in regular mode or in debug mode for operation of multiplexer 604, may be provided for example from a configuration fuse (readily available in a PLD). By employing one or more configuration fuses, an additional input path to the memory for control signal 606 would not be required. Test signal 602 (WL_EN_TEST) also would not require any additional input pin or path and may be provided by a configuration fuse or via an unused input pin (e.g., memory may be configured in a 16 k by 1 memory in the debug mode and utilize a data input path), depending upon the memory configuration and test requirements.

It should be understood that FIG. 6 illustrates an exemplary application for the techniques, in accordance with one or more embodiments of the present invention, where it would be desirable to externally control the timing of an internal node or signal. It should also be understood that this concept can be extended to other types of internal nodes or signals and applications and, furthermore, that the techniques may be utilized to probe the same internal node or signal in several different memory configurations.

Figure 7:
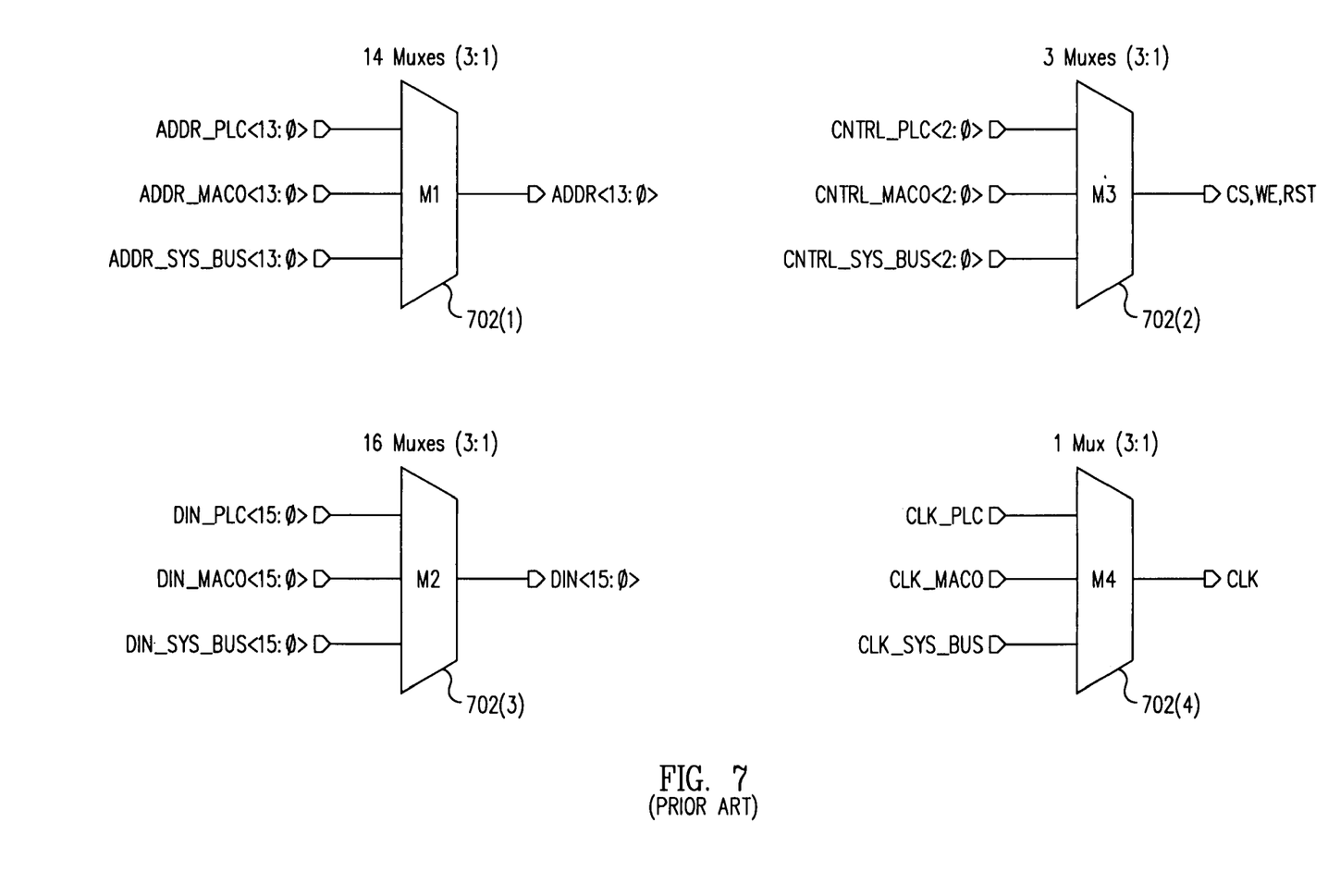
FIG. 7 shows a block diagram illustrating a conventional circuit.

As another example of an exemplary application, the techniques disclosed herein may be applied to input multiplexers (e.g., for a memory). For example, FIG. 7 shows a block diagram illustrating input multiplexers 702(1) through 702(4) (e.g., a typical input multiplexer structure) for a memory in a PLD. For this example, the input signals (e.g., addresses (ADDR), input data (DIN), control signals (CNTRL), and clock (CLK)) to the memory via input multiplexers 702(1) through 702(4) may be provided from logic blocks (signals identified as PLC), a system bus (signals identified as SYS_BUS), or from application specific integrated circuit (ASIC) blocks (signals identified as MACO) within the PLD. As discussed herein, configuration fuses may be used to control input multiplexers 702(1) through 702(4) to determine whether input signals from the logic blocks, the system bus, or the ASIC blocks are selected.

Figure 8:
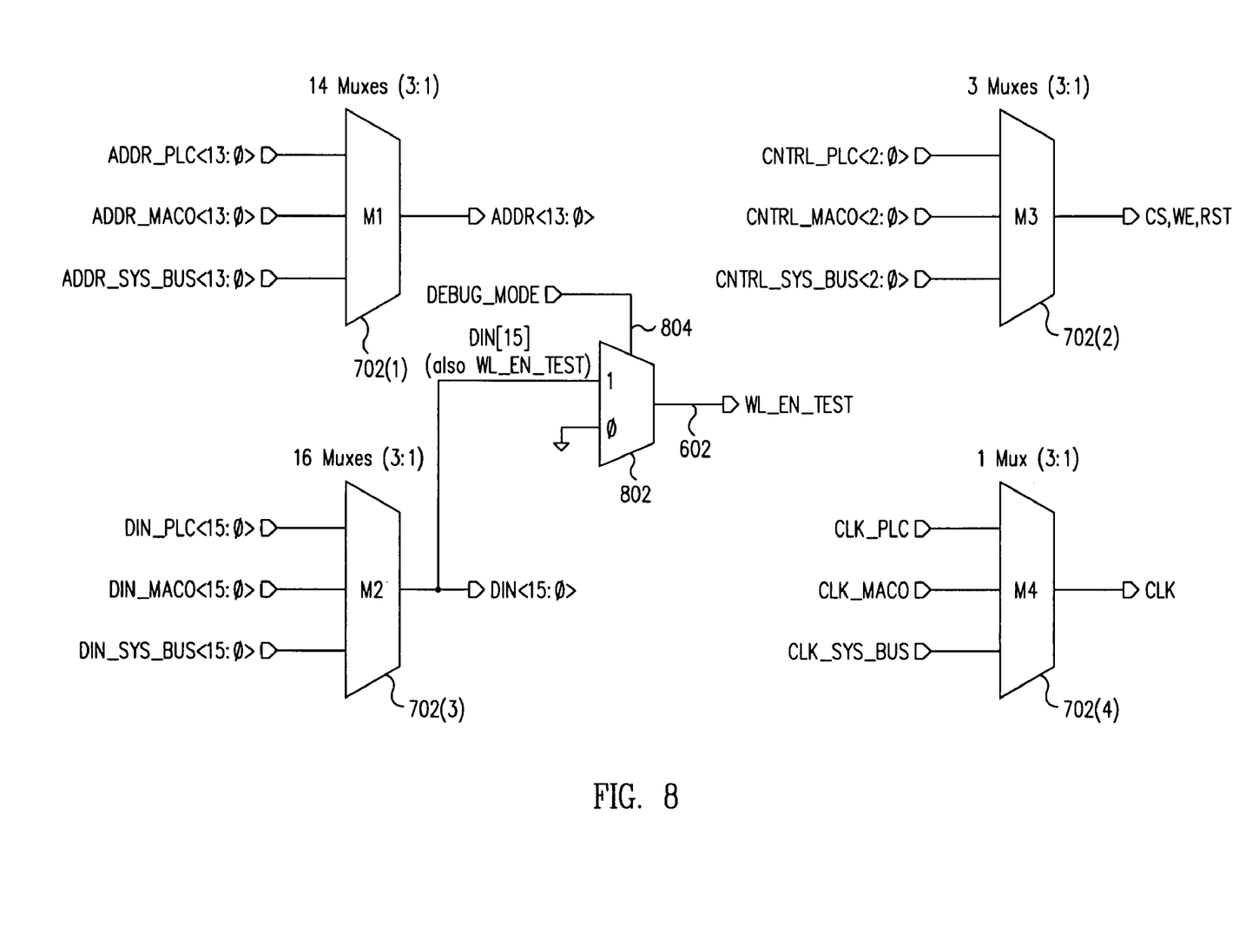
FIG. 8 shows a block diagram illustrating a circuit in accordance with an embodiment of the present invention.

FIG. 8 shows a block diagram illustrating input multiplexers 702(1) through 702(4) and an input multiplexer 802 in accordance with an embodiment of the present invention. Input multiplexer 802 is provided for the input multiplexer structure of FIG. 7 to accommodate a design-for-test feature.

For this exemplary implementation, the debug mode will be used when the memory is configured as a 16K by 1 memory. Therefore, in the 16 k by 1 mode, signals DIN[15:1] from input multiplexer 702(3) are unused (only DIN[0] is used). Signal DIN[15] for this example is selected to serve a dual purpose as a data signal in the 1 k by 16 mode and as test signal 602 (WL_EN_TEST) in the 2 k by 8 configuration in the debug mode. In the debug mode, test signal 602 (WL_EN_TEST) may be provided via one of the existing pins on the PLD and then routed through the PLD fabric (or routing structure) to input multiplexer 702(3) (e.g., as signal DIN_PLC[15]).

Figure 9:
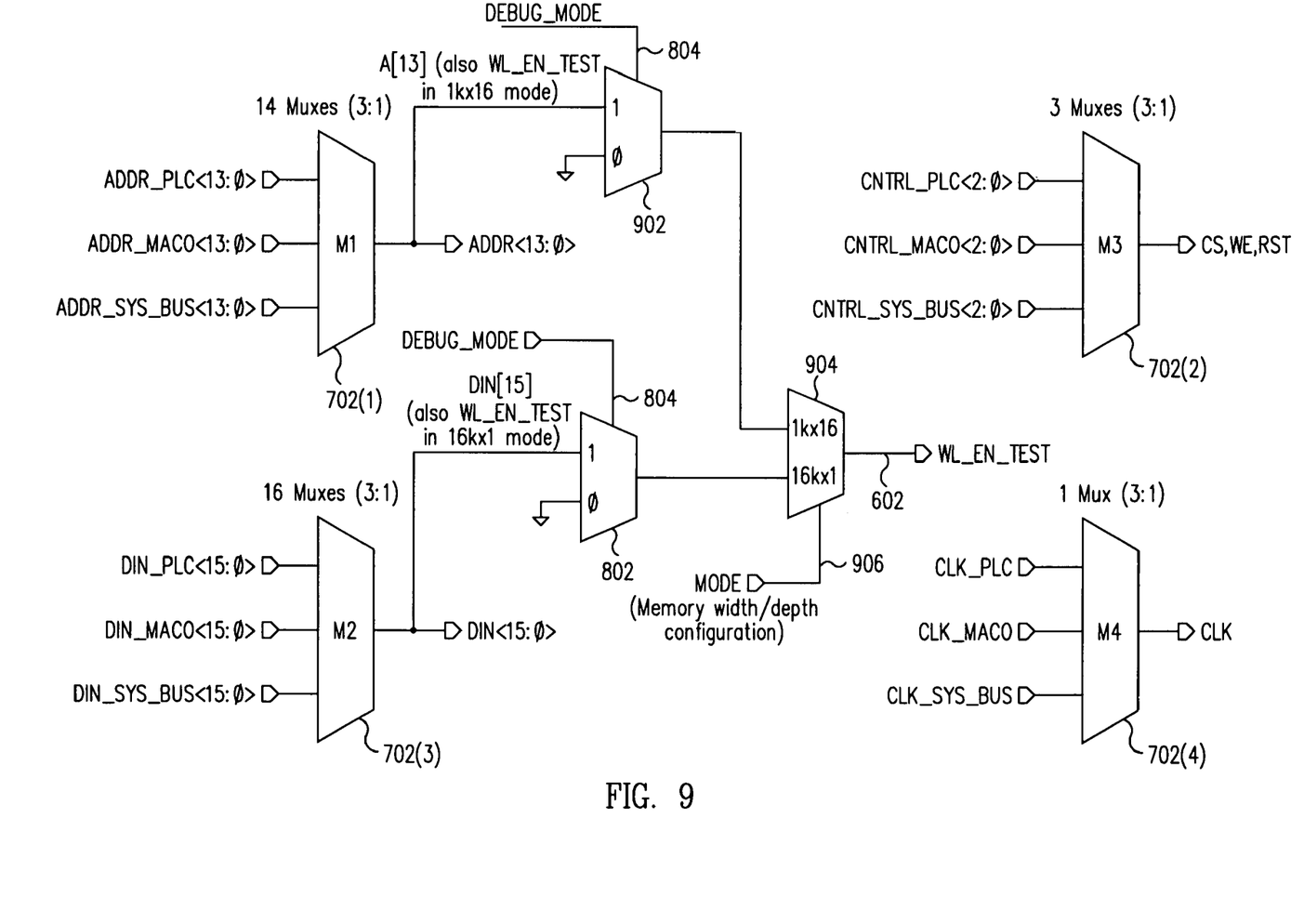
FIG. 9 shows a block diagram illustrating a circuit in accordance with an embodiment of the present invention.

The techniques disclosed in reference to FIG. 8 may be extended further with respect to different memory modes or configurations. For example, FIG. 9 shows a block diagram illustrating input multiplexers 702(1) through 702(4), input multiplexer 802, and input multiplexers 902 and 904 in accordance with an embodiment of the present invention. Input multiplexers 902 and 904 are provided for the input multiplexer structure of FIG. 8 to accommodate a design-for-test feature.

For this exemplary implementation, the design-for-test feature may be utilized for both 1 k by 16 and 16 k by 1 modes. In the 16 k by 1 mode, for example as discussed above, a number of the signals DIN[15:1] (data inputs to the memory) are unused. In the 1 k by 16 mode, for example, a number of address signals (ADDR[13:10]) from input multiplexer 702 (1) are unused. Thus, in the 1 k by 16 mode, test signal 602 (WL_EN_TEST) may be provided, for example, through the signal ADDR[13], while in the 16 k by 1 mode, test signal 602 (WL_EN_TEST) is provided through the signal DIN[15]. Control signals 804 and 906, which control input multiplexers 802, 902, and 904 as shown in FIG. 9, may be provided for example as disclosed herein, by configuration fuses within the PLD.

It should be understood that FIGS. 8 and 9 are two exemplary illustrations of providing one or more external signals as input signals to the memory, which may be configured in specific configurations. Furthermore, it should be understood that the techniques disclosed herein may be extrapolated to several external signals and to different memory sizes, widths, and configurations and to other applications.

Figure 10:
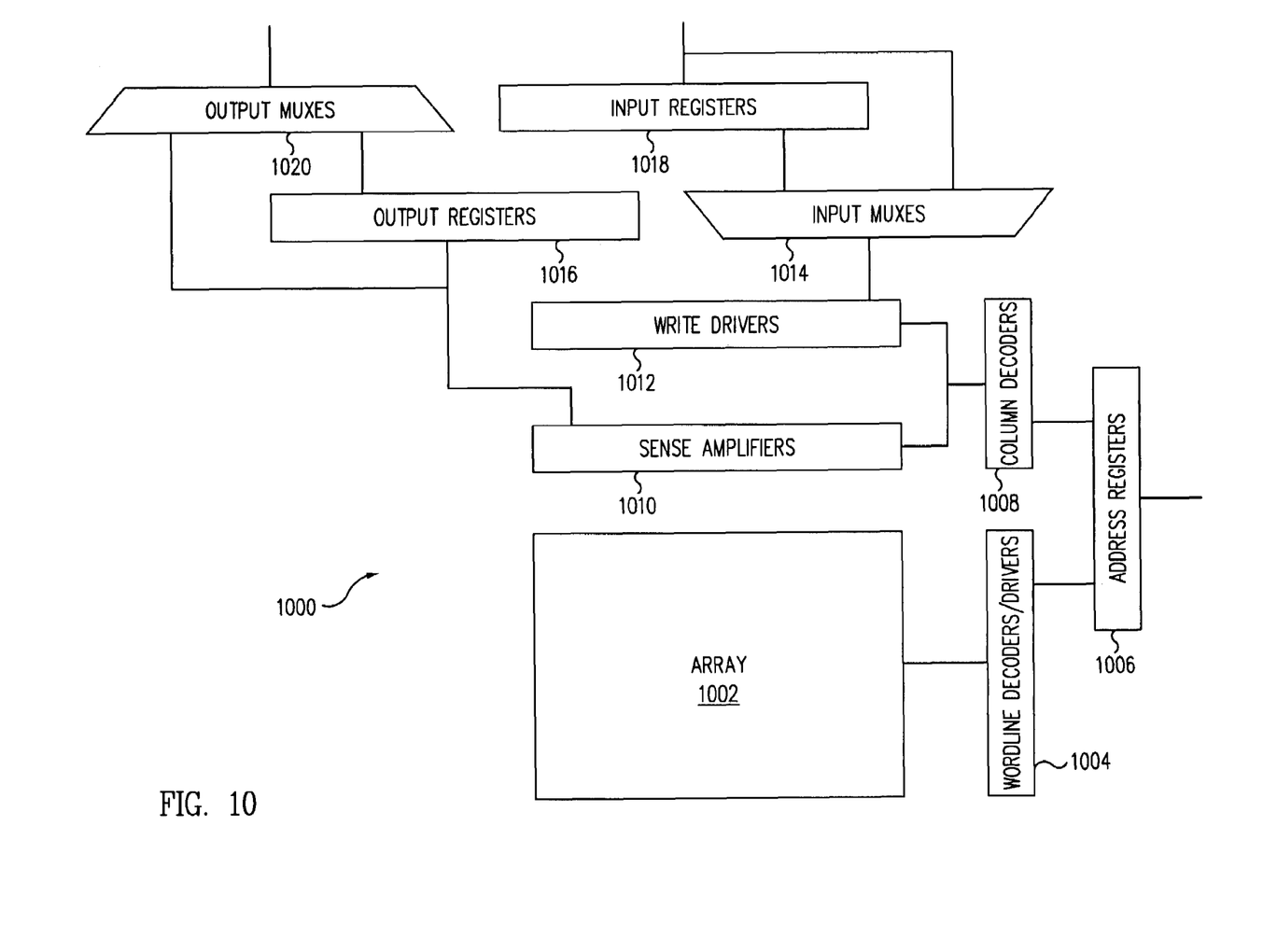
FIG. 10 shows a block diagram illustrating a memory in accordance with an embodiment of the present invention.

FIG. 10 shows a block diagram illustrating a circuit 1000 in accordance with an embodiment of the present invention. Circuit 1000 represents, for example, an exemplary memory (e.g., within a PLD), which may incorporate one or more techniques disclosed herein. In general, circuit 1000 includes a memory array 1002, wordline decoders/drivers 1004, address registers 1006, column decoders 1008, sense amplifiers 1010, write drivers 1012, input multiplexers 1014, output registers 1016, input registers 1018, and output multiplexers 1020.

As an example, the techniques disclosed in reference to FIGS. 2 and 3 may be applied to output multiplexers 1020. As another example, the techniques disclosed in reference to FIG. 6 may be applied to wordline decoders/drivers 1004, while the techniques disclosed in reference to FIGS. 8 and 9 may be applied to input multiplexers 1014. Thus, for example, the techniques disclosed herein may be applied to a conventional memory or to other types of applications to provide greater test and debug capability.

Systems and methods are disclosed herein to provide test features for integrated circuits. For example, in accordance with an embodiment of the present invention, design-for-test features for a memory in a PLD are disclosed (e.g., to facilitate silicon debug and testing). The die area overhead and routing congestion may be kept to a minimum and design changes may only require expanding one or more existing output multiplexers and/or adding one or more multiplexers. Furthermore, the design-for-test features may significantly increase the silicon debug capability, shorten the design and debug cycle, and reduce test time and costs.

As an example, the design-for-test features allow the probing of critical internal signals during silicon debugging and testing. An additional output pin is not required to port out the internal signal and routing congestion (e.g., at the memory interface) generally does not significantly increase.

As another example, the design-for-test features allow an external signal to be provided as an input signal to control internal timing (e.g., during a debug mode). In general, no additional input pin is required to route the external signal, for example, as an input signal to the memory and routing congestion generally does not significantly increase.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
   a wordline driver having an address input terminal, an enable input terminal, and a driver output terminal, the wordline driver configured to drive wordlines in a memory;
   an address decoder coupled to the address input terminal of the wordline driver;
   a multiplexer having an output terminal, input terminals, and a select terminal, the output terminal of the multiplexer coupled to the enable input terminal of the wordline driver;
   an enable signal source coupled to a first input terminal of the multiplexer for asserting a wordline enable signal, the wordline enable signal possibly causing a failure of the integrated circuit if asserted before new address signals from the address decoder to the wordline driver have settled;
   a test signal source coupled to a second input terminal of the multiplexer for asserting a wordline enable test signal, the timing of the wordline enable test signal controllable to test whether a failure of the integrated circuit is due to the wordline enable signal being asserted before new address signals from the address decoder to the wordline driver have settled; and
   a control signal source coupled to the select terminal of the multiplexer,
   wherein the multiplexer is responsive to the control signal source in coupling either the enable signal source or the test signal source to the enable input terminal of the wordline driver.

2. The integrated circuit of claim 1, wherein the enable signal source comprises:
   logic circuitry adapted to receive and combine a chip enable signal and a chip select signal and to generate at its output a wordline enable signal based on the combination; and
   a delay element coupled to the output of the logic circuitry and to the first input terminal of the multiplexer.

3. The integrated circuit of claim 1, wherein the test signal source comprises a configuration fuse adapted to be configured with a test signal.

4. The integrated circuit of claim 1, wherein the test signal source comprises an unused input pin adapted to receive a test signal.

5. The integrated circuit of claim 1, wherein the control signal source comprises a configuration fuse adapted to be configured with a control signal.

* * * * *